US011993729B2

(12) United States Patent
Daeschlein et al.

(10) Patent No.: US 11,993,729 B2
(45) Date of Patent: May 28, 2024

(54) CHEMICAL MECHANICAL POLISHING COMPOSITION

(71) Applicant: BASF SE, Ludwigshafen am Rhein (DE)

(72) Inventors: Christian Daeschlein, Herne (DE); Max Siebert, Ludwigshafen (DE); Yongqing Lan, Ludwigshafen (DE); Michael Lauter, Ludwigshafen (DE); Sheik Ansar Usman Ibrahim, Waterloo (BE); Reza M Golzarian, Hillsboro, OR (US); Te Yu Wei, Taoyuan (TW); Haci Osman Guevenc, Ludwigshafen (DE); Julian Proelss, Ludwigshafen (DE); Leonardus Leunissen, Veldhoven (NL)

(73) Assignee: BASF SE (DE)

( * ) Notice: Subject to any disclaimer, the term of this patent is extended or adjusted under 35 U.S.C. 154(b) by 0 days.

(21) Appl. No.: 16/765,665

(22) PCT Filed: Nov. 12, 2018

(86) PCT No.: PCT/EP2018/080888
§ 371 (c)(1),
(2) Date: May 20, 2020

(87) PCT Pub. No.: WO2019/101555
PCT Pub. Date: May 31, 2019

(65) Prior Publication Data
US 2020/0299547 A1   Sep. 24, 2020

(30) Foreign Application Priority Data

Nov. 22, 2017   (EP) ..................................... 17203056

(51) Int. Cl.
*C09G 1/02*   (2006.01)
*H01L 21/321*   (2006.01)

(52) U.S. Cl.
CPC ............ *C09G 1/02* (2013.01); *H01L 21/3212* (2013.01)

(58) Field of Classification Search
CPC ..... C09G 1/02; H01L 21/3212; C09K 3/1409; C09K 3/1454
See application file for complete search history.

(56) References Cited

U.S. PATENT DOCUMENTS

| | | | |
|---|---|---|---|
| 5,230,833 A | 7/1993 | Romberger | |
| 6,468,913 B1 * | 10/2002 | Pasqualoni | C09G 1/02 438/693 |
| 6,840,971 B2 | 1/2005 | Wang et al. | |
| 7,485,162 B2 * | 2/2009 | Matsuda | C09G 1/02 438/692 |
| 9,505,951 B2 * | 11/2016 | Umeda | C09G 1/02 |
| 10,428,241 B2 * | 10/2019 | Mishra | H01L 21/31053 |
| 10,870,799 B2 * | 12/2020 | Liu | C09K 13/08 |
| 10,899,945 B2 * | 1/2021 | Reichardt | B24B 37/044 |
| 2002/0016275 A1 * | 2/2002 | Yano | C09K 3/1463 510/508 |
| 2005/0108949 A1 * | 5/2005 | Matsuda | C09K 3/1463 257/E21.583 |
| 2005/0233578 A1 * | 10/2005 | Jia | H01L 21/32125 438/692 |
| 2006/0046490 A1 * | 3/2006 | Banerjee | C09G 1/02 438/692 |
| 2006/0175298 A1 * | 8/2006 | Zhao | B24B 37/044 438/692 |
| 2007/0293049 A1 * | 12/2007 | Minamihaba | C09G 1/02 438/692 |
| 2008/0261400 A1 * | 10/2008 | Yoshida | H01L 21/3212 438/692 |
| 2010/0038584 A1 * | 2/2010 | Du | C25F 3/30 438/692 |
| 2010/0099259 A1 * | 4/2010 | Takemiya | C09G 1/02 438/692 |
| 2010/0151684 A1 * | 6/2010 | Choi | C09G 1/02 438/693 |
| 2013/0186850 A1 * | 7/2013 | Wang | H01L 23/53238 216/13 |
| 2013/0344696 A1 | 12/2013 | Li et al. | |
| 2014/0011362 A1 * | 1/2014 | Reichardt | H01L 21/30625 438/693 |

(Continued)

FOREIGN PATENT DOCUMENTS

JP          2009-088182 A       4/2009
JP    JP-WO2017061229 A1 * 10/2017  ....... H01L 21/02024

(Continued)

OTHER PUBLICATIONS

International Search Report dated Jan. 15, 2019 in PCT/EP2018/080888 filed Nov. 12, 2018.
U.S. Appl. No. 16/084,166, filed Sep. 11, 2018, Lauter, M., et al.
U.S. Appl. No. 16/064,918, filed Jun. 21, 2018, US 2018-0371371 A1, Daeschlein, C., et al.
U.S. Appl. No. 16/064,686, filed Jun. 21, 2018, US 2019-0002802 A1, Daeschlein, C., et al.
U.S. Appl. No. 16/311,888, filed Dec. 20, 2018, US 2019-0203009 A1, Keppeler, U., et al.

(Continued)

*Primary Examiner* — Duy Vu N Deo
*Assistant Examiner* — Christopher Remavege
(74) *Attorney, Agent, or Firm* — Faegre Drinker Biddle & Reath LLP

(57) ABSTRACT

The presently claimed subject matter is directed to a chemical mechanical polishing (CMP) composition comprising inorganic particles, at least one organic compound comprising an amino group and/or at least one acid group (Y), potassium persulfate, at least one corrosion inhibitor and an aqueous medium for polishing substrates of the semiconductor industry comprising cobalt and/or a cobalt alloy and TiN and/or TaN.

21 Claims, No Drawings

(56) References Cited

U.S. PATENT DOCUMENTS

| | | | |
|---|---|---|---|
| 2016/0068710 A1* | 3/2016 | Wang | H01L 21/3212 |
| | | | 438/693 |
| 2016/0200975 A1* | 7/2016 | Cooper | H01L 21/31111 |
| | | | 216/13 |
| 2017/0009101 A1* | 1/2017 | Yasui | B24B 37/044 |
| 2018/0230333 A1 | 8/2018 | Reichardt et al. | |
| 2019/0077991 A1* | 3/2019 | Shinoda | H01L 21/31053 |
| 2019/0085206 A1* | 3/2019 | Theivanayagam | H01L 21/304 |

FOREIGN PATENT DOCUMENTS

| | | |
|---|---|---|
| WO | WO 2004/063301 A1 | 7/2004 |
| WO | WO 2017/025536 A1 | 2/2017 |

OTHER PUBLICATIONS

U.S. Appl. No. 16/094,381, filed Oct. 17, 2018, Reichardt, R., et al.
U.S. Appl. No. 16/307,191, filed Dec. 5, 2018, US 2019-0144781 A1, C., et al.
Extended European Search Report dated May 18, 2018 in European Patent Application No. 17203056.1, 3 pages.
Kuntzsch, T., et al., "Characterization of Slurries Used for Chemical-Mechanical Polishing (CMP) in the Semiconductor Industry", Chemical Engineering & Technology, vol. 26, Issue 12, Nov. 17, 2003, pp. 1235-1239.

* cited by examiner

CHEMICAL MECHANICAL POLISHING COMPOSITION

The presently claimed subject matter is directed to a chemical mechanical polishing (CMP) composition comprising inorganic particles, at least one organic compound comprising an amino group and/or at least one acid group (Y), potassium persulfate, at least one corrosion inhibitor and an aqueous medium for polishing substrates of the semiconductor industry comprising cobalt and/or a cobalt alloy and TiN and/or TaN.

DESCRIPTION

In the semiconductor industry, chemical mechanical polishing (abbreviated as CMP) is a well-known technology applied in fabricating advanced photonic, microelectromechanical, and microelectronic materials and devices, such as semiconductor wafers.

During the fabrication of materials and devices used in the semiconductor industry, CMP is employed to planarize metal and/or oxide surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

With the continuous shrink of feature size in ultra large scale integrated Circuits (ULSI) technology, the size of the copper interconnect structure is getting smaller and smaller. To reduce the RC delay, the thickness of barrier or adhesion layer in the copper interconnect structure is getting thinner. The traditional copper barrier/adhesion layer stack Ta/TaN is not suitable any more, as the resistivity of Ta is relatively high and copper cannot be directly electroplated onto Ta. Compared with Ta, cobalt has lower resistivity and is cheaper. The adhesion between Cu and Co is good. Cu can easily nucleate on Co, also copper can be directly electroplated on cobalt.

In integrated circuits, Co is used as adhesion or barrier layer for copper interconnects, while Co can also be used as nano-crystalline Co in memory device and as metal gate in MOSFET.

Porous low k dielectrics material has been already used in the current interconnect structures. It is reported that low k material can be easily damaged by plasma or polishing slurries. In current chemical mechanical polishing processing, to reduce the damage to low-k dielectrics, most of the current slurries used for copper and barriers are acidic. But it is observed that copper and cobalt easily suffered from dissolution in acidic solution containing oxidant for example hydrogen peroxide. This makes the polishing rate of copper and cobalt too high so that it will induce the dishing of copper lines. In addition, the dissolution of the cobalt adhesion layer on the sidewall of the copper interconnect structure can lead to the delamination of copper lines and cause reliability problems.

Another application of Cobalt in semiconductor chip manufacturing is the deposition of cobalt by CVD or PVD methods into trenches or vias. The dielectric layer is covered by a liner to make sure that the Co will not delaminate or diffuse into the dielectric layer. As liner and/or barrier, a layer of Ti/TiN and/or Ta/TaN can be used. For damascene like CMP of Co-coated wafers, it is good to remove Co and the liner in one step. So, a high removal rate for Co and Ti/TiN and/or Ta/TaN is advantageous. On the other hand, the dielectric layer should not be damaged, so a low rate for this type of material is required.

This coexistence of Co, Cu, low k dielectric materials, Ti/TiN and/or Ta/TaN in different amounts and layer thickness depending on the used integration scheme in ultra large scale integrated Circuits (ULSI) technology gives up multiple challenges, in terms of selectivity, corrosion, removal rates and surface quality, to the compositions used for chemical mechanical polishing in the production of semiconductor devices.

CMP compositions comprising inorganic particles, at least one organic compound comprising an amino-group and at least one acid group (Y), an oxidizer and an aqueous medium for polishing substrates of the semiconductor industry comprising metal and Ti/TiN and/or Ta/TaN are known and described, for instance, in the following reference.

U.S. Pat. No. 6,840,971 B2 discloses an alpha-amino acid containing chemical mechanical polishing compositions and slurries that are useful for polishing substrates including multiple layers of metals, or metals and dielectrics, for example Cu/TiN/Ti and Cu/TaN/Ta multi-layer substrates. Beside the alpha-amino acid the slurry comprises abrasive particles, oxidizer and optionally further ingredients including passivation film forming agents, dispersants, surfactants, polishing stopping compounds and stabilizers. Especially useful for polishing substrates including copper, titanium, titanium nitride, tantalum, tantalum nitride, tungsten, and tungsten nitride layers at good rates under controllable conditions.

Use of CMP composition for chemical mechanical polishing of substrates comprising cobalt and/or a cobalt alloy and TiN and/or TaN is disclosed in PCT/EP2016/068964. The used CMP composition has a pH value of more than 6 and less than 9. The typical components of the used CMP composition are colloidal silica particles, organic compound comprising an amino group and an acid group, hydrogen peroxide as an oxidizer and an aqueous medium. The used CMP composition further also comprises a corrosion inhibitor and a non-ionic surfactant.

The existing CMP compositions, however, are incapable of providing a control on the material removal rate (abbreviated as MRR) of Co, Ti/TiN and/or Ta/TaN. Further, these CMP compositions fail to provide a narrower ratio of MRR for TiN:TaN to cater for various applications in the semiconductor as well as other allied industries. Additionally, the prior art CMP compositions also lead to corrosion and material deterioration of the substrate due to the acidic pH value of the composition.

Thus, it was an objective of the presently claimed subject matter to provide a CMP composition which avoids corrosion and material deterioration of the substrate and provides a better control over the MRR of Co, Ti/TiN and/or Ta/TaN with a TiN:TaN ratio of MRR in the range of $\geq 0.5$ to $\leq 2.0$.

SUMMARY

Surprisingly, it has been found that a CMP composition comprising potassium persulfate as an oxidizer and with a pH value in the range of $\geq 8.5$ to $\leq 11.0$ is capable of providing a better control over the MRR of Co, Ti/TiN and/or Ta/TaN with minimal corrosion and material deterioration of the substrate. The controlled TiN:TaN ratio of MRR in the range of ≥0.5 to ≤2.0 renders the CMP composition to prevent TiN or TaN dishing or protrusion.

Hence, in one embodiment, the presently claimed subject matter is directed to a chemical mechanical polishing composition comprising
(A) ≥0.10 wt.-% to ≤4.00 wt.-% of inorganic particles,
(B) ≥0.10 wt.-% to ≤0.90 wt.-% of at least one organic compound comprising an amino group and/or at least one acid group (Y),
(C) ≥0.20 wt.-% to ≤0.90 wt.-% of potassium persulfate,
(D) ≥95.00 wt.-% to ≤99.58 wt.-% of an aqueous medium,
(E) ≥0.01 wt.-% to ≤0.50 wt.-% of at least one corrosion inhibitor, and
(K) ≥0.01 wt.-% to ≤1.50 wt.-% of at least one additive, wherein the composition has a pH ≥8.5 to ≤11.0, and wherein wt.-% is based on the total weight of the composition and the sum of wt.-% of the components (A), (B), (C), (D), (E) and (K) adds up to 100% wt.-%.

In another embodiment of the presently claimed subject matter, the above composition is characterized in that the pH of the composition is ≥8.5 to ≤10.0.

In another embodiment of the presently claimed subject matter, the above composition is characterized in that the amount of potassium persulfate is ≥0.30 wt.-% to ≤0.70 wt.-%.

In another embodiment of the presently claimed subject matter, the above composition is characterized in that the inorganic particles (A) are colloidal inorganic particles.

In another embodiment of the presently claimed subject matter, the above composition is characterized in that the colloidal inorganic particles are colloidal silica particles.

In another embodiment of the presently claimed subject matter, the above composition is characterized in that the at least one organic compound (B) is a non-polymeric compound with a molecular weight below 600 g/mol.

In another embodiment of the presently claimed subject matter, the above composition is characterized in that the acid group (Y) in the organic compound (B) is selected from the group consisting of carboxylic acid, sulfonic acid and phosphoric acid.

In another embodiment of the presently claimed subject matter, the above composition is characterized in that the organic compound (B) is selected from the group consisting amino acids, substituted ethylenediamine and polycarboxylic acids.

In another embodiment of the presently claimed subject matter, the above composition is characterized in that the organic compound (B) is selected from the group consisting of glycine, glutamic acid, aspartic acid, ethylenediaminetetraacetic acid, diethylene triamine pentaacetic acid, cysteic acid, aminotris(methylenephosphonic acid), diethylenetriamine penta(methylene phosphonic acid), ethylenediamine tetra(methylene phosphonic acid), malonic acid, citric acid and tartaric acid.

In another embodiment of the presently claimed subject matter, the above composition is characterized in that the aqueous medium is de-ionized water.

In another embodiment of the presently claimed subject matter, the above composition is characterized in that the corrosion inhibitor (E) is selected from the group consisting of imidazole, benzimidazole, benzotriazole, 4-(dimethylamino) benzoic acid, terephthalic acid, Isophthalic acid, 6,6',6"-(1,3,5-Triazine-2,4,6-triyltriimino)trihexanoic acid, phenyltetrazole, N-Lauroylsarcosine, 4-Dodecylbenzene sulfonic acid, phosphoric acid C6-C10 alkyl ester, polyaspartate and mixtures and salts thereof.

In another embodiment of the presently claimed subject matter, the above composition is characterized in that the at least one additive is selected from the group consisting of surfactants (F), biocides (H), pH adjusting agents, buffer substances, stabilizers and friction reducing agents.

In a further aspect of the presently claimed subject matter, use of the above composition for chemical mechanical polishing of a substrate comprising (i) cobalt and/or (ii) a cobalt alloy and (iii) TiN and/or TaN.

In another aspect of the presently claimed subject matter, a process for the manufacture of a semiconductor device comprising the chemical mechanical polishing of a substrate used in the semiconductor industry wherein the substrate comprises
(i) cobalt, and/or
(ii) a cobalt alloy, and
(iii) TiN and/or TaN
in presence of the above composition.

In an embodiment of the presently claimed subject matter, the above process is characterized in that the TiN:TaN ratio of material removal rate is in the range of ≥0.5 to ≤2.0.

DETAILED DESCRIPTION

The chemical mechanical polishing composition of the present subject matter comprises
(A) ≥0.10 wt.-% to ≤4.00 wt.-% of inorganic particles,
(B) ≥0.10 wt.-% to ≤0.90 wt.-% of at least one organic compound comprising an amino group and/or at least one acid group (Y),
(C) ≥0.20 wt.-% to ≤0.90 wt.-% of potassium persulfate,
(D) ≥95.00 wt.-% to ≤99.58 wt.-% of an aqueous medium,
(E) ≥0.01 wt.-% to ≤0.50 wt.-% of at least one corrosion inhibitor, and
(K) ≥0.01 wt.-% to ≤1.50 wt.-% of at least one additive, wherein the composition has a pH ≥8.5 to ≤11.0, and wherein wt.-% is based on the total weight of the composition and the sum of wt.-% of the components (A), (B), (C), (D), (E) and (K) adds up to 100% wt.-%.

Generally, the chemical nature of inorganic particles (A) is not particularly limited. (A) may be of the same chemical nature or a mixture of particles of different chemical nature. As a rule, particles (A) of the same chemical nature are preferred.

(A) may be
  inorganic particles such as a metal, a metal oxide or carbide, including a metalloid, a metalloid oxide or carbide, or
  a mixture of inorganic particles.
Generally, (A) may be
  of one type of colloidal inorganic particles,
  of one type of fumed inorganic particles,
  a mixture of different types of colloidal and/or fumed inorganic particles,
Generally, colloidal inorganic particles are inorganic particles which are produced by a wet precipitation process; fumed inorganic particles are produced by high temperature flame hydrolysis of for example metal chloride precursor with hydrogen in the presence of oxygen, for example using the Aerosil® process.

Preferably, inorganic particles (A) are colloidal or fumed inorganic particles or a mixture thereof. Among them, oxides and carbides of metals or metalloids are preferred. More preferably, particles (A) are alumina, ceria, copper oxide, iron oxide, nickel oxide, manganese oxide, silica, silicon nitride, silicon carbide, tin oxide, titania, titanium carbide, tungsten oxide, yttrium oxide, zirconia, or mixtures or composites thereof. Most preferably, particles (A) are alumina, ceria, silica, titania, zirconia, or mixtures or composites thereof. In particular, (A) are silica particles. In an embodiment, (A) are colloidal silica particles.

As used herein, the term "colloidal silica" refers to silicon dioxide that has been prepared by condensation polymerization of $Si(OH)_4$. The precursor $Si(OH)_4$ may be obtained, for example, by hydrolysis of high purity alkoxysilanes, or by acidification of aqueous silicate solutions. Such colloidal silica may be prepared in accordance with U.S. Pat. No. 5,230,833 or may be obtained as any of various commercially available products, such as the Fuso PL-1, PL-2, and PL-3 products, and the Nalco 1050, 2327 and 2329 products, as well as other similar products available from DuPont, Bayer, Applied Research, Nissan Chemical, Nyacol and Clariant.

According to the present subject matter, the amount of inorganic particles (A) in the CMP composition is ≥0.10 wt.-% to ≤4.00 wt.-% based on the total weight of the CMP composition. Preferably, the amount of (A) in the CMP composition is ≥0.15 wt.-% to ≤4.00 wt.-%. More preferably the amount of (A) in the CMP composition is ≥0.20 wt.-% to ≤4.00 wt.-%, even more preferably the amount of (A) in the CMP composition is ≥0.25 wt.-% to ≤4.00 wt.-% or ≥0.30 wt.-% to ≤4.00 wt.-% or ≥0.35 wt.-% to ≤4.00 wt.-%. Most preferably the amount of (A) in the CMP composition is ≥0.40 wt.-% to ≤4.00 wt.-% or ≥0.45 wt.-% to ≤4.00 wt.-%. The amount of (A) is in each case based on the total weight of the CMP composition. In an embodiment, the amount of (A) in the CMP composition is ≥0.50 wt.-% to ≤4.00 wt.-% based on the total weight of the CMP composition.

Generally, the particles (A) may be contained in the CMP composition in various particle size distributions. The particle size distribution of the particles (A) may be monomodal or multimodal. In case of multimodal particle size distribution, bimodal is often preferred. In order to have an easily reproducible property profile and easily reproducible conditions during the CMP process of the present subject matter, a monomodal particle size distribution may be preferred for the particles (A). Often it is most preferred for the particles (A) to have a monomodal particle size distribution. The particle size distribution which the particles may have is not limited.

The mean particle size of the particles (A) may vary within a wide range. The mean particle size is the $d_{50}$ value of the particle size distribution of the particles (A) in the aqueous medium (E) and may be measured for example using dynamic light scattering (DLS) or static light scattering (SLS) methods. These and other methods are well known in the art, see e.g. Kuntzsch, Timo; Witnik, Ulrike; Hollatz, Michael Stintz; Ripperger, Siegfried; Characterization of Slurries Used for Chemical-Mechanical Polishing (CMP) in the Semiconductor Industry; Chem. Eng. Technol; 26 (2003), volume 12, page 1235.

For DLS, typically a Horiba LB-550 V (DLS, dynamic light scattering measurement according to manual) or any other such instrument is used. This technique measures the hydrodynamic diameter of the particles as they scatter a laser light source (A=650 nm), detected at an angle of 90° or 173° to the incoming light. Variations in the intensity of the scattered light are due to the random Brownian motion of the particles as they move through the incident beam and are monitored as a function of time. Autocorrelation functions performed by the instrument as a function of delay time are used to extract decay constants; smaller particles move with higher velocity through the incident beam and correspond to faster decays.

These decay constants are proportional to the diffusion coefficient, $D_t$, of the particle and are used to calculate particle size according to the Stokes-Einstein equation:

$$D_h = \frac{k_B T}{3\pi\eta D_t}$$

where the suspended particles are assumed to (1) have a spherical morphology and (2) be uniformly dispersed (i.e. not agglomerated) throughout the aqueous medium (E). This relationship is expected to hold true for particle dispersions that contain lower than 1% by weight of solids as there are no significant deviations in the viscosity of the aqueous dispersant (E), in which q=0.96 mPa·s (at T=22° C.). The particle size distribution of the fumed or colloidal inorganic particle dispersion (A) is usually measured in a plastic cuvette at 0.1 to 1.0% solid concentration and dilution, if necessary, is carried out with the dispersion medium or ultra-pure water.

Preferably, the mean particle size of the particles (A) is in the range of from 20 to 200 nm, more preferably in the range of from 25 to 180 nm, most preferably in the range of from 30 to 170 nm, particularly preferably in the range of from 40 to 160 nm, and in particular in the range of from 45 to 150 nm, as measured with dynamic light scattering techniques using instruments for example a High-Performance Particle Sizer (HPPS) from Malvern Instruments, Ltd. or Horiba LB550.

The BET surface determined according to DIN ISO 9277:2010-09 of the particles (A) may vary within a wide range. Preferably, the BET surface of the particles (A) is in the range of from 1 to 500 $m^2/g$, more preferably in the range of from 5 to 250 $m^2/g$, most preferably in the range of from 10 to 100 $m^2/g$, in particular in the range of from 20 to 95 $m^2/g$, for example in the range of from 25 to 92 $m^2/g$.

The particles (A) may be of various shapes. Thereby, the particles (A) may be of one or essentially only one type of shape. However, it is also possible that the particles (A) have different shapes.

For instance, two types of differently shaped particles (A) may be present. For example, (A) may have the shape of agglomerates, cubes, cubes with bevelled edges, octahedrons, icosahedrons, cocoons, nodules or spheres with or without protrusions or indentations. Preferably, they are essentially spherical, whereby typically these have protrusions or indentations.

It may be preferred that, the inorganic particles (A) are cocoon-shaped. The cocoons may be with or without protrusions or indentations. Cocoon-shaped particles are particles with a minor axis of from 10 to 200 nm, a ratio of major/minor axis of 1.4 to 2.2, more preferably of 1.6 to 2.0. Preferably they have an averaged shape factor of from 0.7 to 0.97, more preferably of from 0.77 to 0.92, preferably an averaged sphericity of from 0.4 to 0.9, more preferably of from 0.5 to 0.7 and preferably an averaged equivalent circle diameter of from 41 to 66 nm, more preferably of from 48 to 60 nm, which may be determined by transmission electron microscopy and scanning electron microscopy.

The determination of the shape factor, the sphericity and the equivalent circle diameter of cocoon-shaped particles is explained hereinbelow.

The shape factor gives information on the shape and the indentations of an individual particle and may be calculated according to the following formula:

$$\text{shape factor} = 4\pi(\text{area}/\text{perimeter}^2)$$

The shape factor of a spherical particle without indentations is 1. The value of shape factor decreases when the number of indentations increases.

The sphericity gives information on the elongation of an individual particle using the moment about the mean and may be calculated according to the following formula wherein M are the centres of gravity of the respective particle:

$$\text{spherecity} = (M_{xx} - M_{yy}) - [4M_{xy}^2 + (M_{yy} - M_{xx})^2]^{0.5} / (M_{xx} - M_{yy}) + [4M_{xy}^2 + (M_{yy} - M_{xx})^2]^{0.5}$$

$$\text{elongation} = (1/\text{spherecity})^{0.5}$$

wherein
$M_{xx} = \Sigma(x - x_{mean})^2 / N$
$M_{yy} = \Sigma(y - y_{mean})^2 / N$
$M_{xy} = \Sigma(x - x_{mean}) \times (y - y_{mean}) / N$
N is the number of pixels forming the image of the respective particle
x, y are the coordinates of the pixels
$x_{mean}$ is the mean value of the x-coordinates of the N pixels forming the image of said particle
$y_{mean}$ is the mean value of the y-coordinates of the N pixels forming the image of said particle The sphericity of a spherical particle is 1. The value of the sphericity decreases when particles are elongated.

The equivalent circle diameter (abbreviated as ECD) of an individual non-circular particle gives information on the diameter of a circle which has the same area as the respective non-circular particle.

The averaged shape factor, averaged sphericity and averaged ECD are the arithmetic averages of the respective property related to the analysed number of particles.

For particle shape characterization, an aqueous cocoon-shaped silica particle dispersion with 20 wt.-% solid content is dispersed on a carbon foil and is dried. The dried dispersion is analyzed by using Energy Filtered-Transmission Electron Microscopy (EF-TEM) (120 kilo volts) and Scanning Electron Microscopy secondary electron image (SEM-SE) (5 kilo volts). The EF-TEM image having a resolution of 2 k, 16 Bit, 0.6851 nm/pixel is used for the analysis. The images are binary coded using the threshold after noise suppression. Afterwards the particles are manually separated. Overlying and edge particles are discriminated and not used for the analysis. ECD, shape factor and sphericity as defined before are calculated and statistically classified.

The CMP composition also comprises at least one organic compound (B) comprising an amino group and/or at least one acid group (Y).

The at least one acid group (Y) is defined as being (Y) as such and its deprotonated form. The acid group (Y) comprised in the organic compound (B) is preferably any acid group so that the pKa value (logarithmic measure of the acid dissociation constant) of
the reaction H—(B) ⇌ (B)⁻+H⁺ or
the reaction [H—(B)]⁺ ⇌ (B)+H⁺
is not more than 7, more preferably not more than 6, most preferably not more than 5.5, particularly preferably not more than 5, as measured in de-ionized water at 25° C. and atmospheric pressure.

The acid group (Y) comprised in organic compound (B) is preferably a carboxylic acid (—COOH), a carbonic acid (—O—COOH), a sulfonic acid (—SO₃H), a sulfuric acid (—O—SO₃H), a phosphonic acid (—P(=O)(OH)₂), a phosphoric acid (—O—P(=O)(OH)₂) moiety, or their deprotonated forms. More preferably, said acid group (Y) is a carboxylic acid (—COOH), a sulfonic acid (—SO₃H), a sulfuric acid (—O—SO₃H) or a phosphonic acid (—P(=O)(OH)₂) moiety, or their deprotonated forms. Most preferably, said acid group (Y) is a carboxylic acid (—COOH) a sulfonic acid (—SO₃H) or a phosphonic acid (—P(=O)(OH)₂) moiety, or its deprotonated form.

The at least one organic compound (B) comprising an amino group and/or at least one acid group (Y), is preferably an amino acid, substituted ethylenediamine and polycarboxylic acid. By the term "polycarboxylic acid", it is referred to a group consisting of di-carboxylic acid, tri-carboxylic acid, tetra-carboxylic acid and penta-carboxylic acid. Preferably, the polycarboxylic acid is selected from a group consisting of di-carboxylic acid, tri-carboxylic acid and tetra-carboxylic acid. More preferably the polycarboxylic acid is selected from a group consisting of di-carboxylic acid and tricarboxylic acid. In an embodiment, the organic compound (B) is selected from a group consisting of an amino acid, substituted ethylenediamine, di-carboxylic acid and tri-carboxylic acid.

The at least one organic compound (B) is a non-polymeric compound preferably with a molecular weight of below 600 g/mol. More preferably with a molecular weight of below 400 g/mol. Most preferably with a molecular weight of below 300 g/mol.

Generally, any organic compound that has an amino group and an acid group are referred to as amino acids. For the purposes of the present subject matter, all individual stereoisomers and racemic mixtures thereof are also contemplated for the amino acids. It may be preferred that both the amino and the acid groups are attached to one carbon (termed as alpha-amino carboxylic acids) are used as the chemical additive in the CMP slurry. Many alpha-amino carboxylic acids are known and there are twenty "natural" amino acids which are used as basic components of proteins in living organisms. The amino acids may be acidic, neutral or basic depending on their side chains in presence of an aqueous carrier. If the side chain of the alpha amino acid contains an additional proton donating group (acidic group) for example a carboxylic group the amino acid is an acidic amino acid.

Substituted in the context of the present subject matter is to be understood as at least one carbon atom containing group covalently bound to at least one of the nitrogen atoms of the ethylene diamine or diethylenetriamine structure if present in the organic compound (B). The carbon atom containing group acts as linking group between the nitrogen containing ethylene diamine or diethylenetriamine structure and the acid group (Y) resulting as entirety in compound (B). The carbon atom containing group is preferably a $CH_2$, a $CH_2CH_2$, a $CH_2CH_2CH_2$ or a $CH_2CH_2CH_2CH_2$ group, more preferably a $CH_2$, a $CH_2CH_2$ or a $CH_2CH_2CH_2$ group, most preferably a $CH_2$ group.

The at least one organic compound (B) is selected from a group consisting of glycine, glutamic acid, aspartic acid, ethylenediaminetetraacetic acid, diethylene triamine pentaacetic acid, cysteic acid, aminotris(methylenephosphonic acid), diethylenetriamine penta(methylene phosphonic acid), ethylenediamine tetra(methylene phosphonic acid), malonic acid, citric acid and tartaric acid. Preferably, the organic compound (B) is selected from the group consisting of glycine, ethylenediaminetetraacetic acid, aminotris(methylenephosphonic acid), diethylenetriamine penta(methylene phosphonic acid), ethylenediamine tetra(methylene phosphonic acid), malonic acid, citric acid and tartaric acid.

More preferably, the organic compound (B) is selected from the group consisting of glycine, ethylenediaminetetraacetic acid, aminotris(methylenephosphonic acid), ethylenediamine tetra(methylene phosphonic acid), malonic acid, citric acid and tartaric acid.

Most preferably, the organic compound (B) is selected from the group consisting of glycine, ethylenediaminetetraacetic acid, ethylenediamine tetra(methylene phosphonic acid), malonic acid, citric acid and tartaric acid. In an embodiment, the organic compound (B) is selected from the group consisting of glycine, ethylenediaminetetraacetic acid, malonic acid, citric acid and tartaric acid.

According to the present subject matter, the amount of at least one organic compound (B) comprising an amino group and/or at least one acid group (Y) is ≥0.10 wt.-% to ≤0.90 wt.-% based on the total weight of the CMP composition. Preferably, the amount of (B) in the CMP composition is ≥0.10 wt.-% to ≤0.88 wt.-%. More preferably the amount of (A) in the CMP composition is ≥0.10 wt.-% to ≤0.86 wt.-%, even more preferably the amount of (A) in the CMP composition is ≥0.10 wt.-% to ≤0.84 wt.-%. Most preferably the amount of (A) in the CMP composition is ≥0.10 wt.-% to ≤0.82 wt.-%. The amount of (B) is in each case based on the total weight of the CMP composition. In an embodiment, the amount of (B) in the CMP composition is ≥0.10 wt.-% to ≤0.81 wt.-% based on the total weight of the CMP composition.

The addition of organic compound (B) comprising an amino group and/or at least one acid group (Y) as polishing additive may increase the material removal rates of all metals namely cobalt and/or cobalt alloy and TiN and/or TaN.

The CMP composition according to the present subject matter comprises potassium persulfate (C) as an oxidizer. In general, an oxidizer is a compound which is capable of oxidizing the to-be polished substrate or one of its layers. In the prior art, such oxides exist as peroxide, persulfate, perchlorate, perbromate, periodate, permanganate or a derivative thereof. However, there has not been much research conducted by using a persulfate as an oxidizer, more preferably potassium persulfate ($K_2S_2O_8$) as the oxidizer. One of the advantages obtained by making such a selection is the control over the MRR of TiN and TaN. The selective oxidizer i.e. potassium persulfate (C) helps in achieving the TiN:TaN ratio of MRR in the range of ≥0.5 to ≤2.0.

Accordingly, the amount of potassium persulfate (C) is ≥0.20 wt.-% to ≤0.90 wt.-% based on the total weight of the CMP composition. Preferably, the amount of (C) is ≥0.20 wt.-% to ≤0.85 wt. %. More preferably the amount of (C) is ≥0.25 wt.-% to ≤0.85 wt.-%, even more preferably the amount of (C) is ≥0.30 wt.-% to ≤0.70 wt.-% or ≥0.30 wt.-% to ≤0.65 wt.-% or ≥0.35 wt.-% to ≤0.65 wt.-%. Most preferably the amount of (C) is ≥0.40 wt.-% to ≤0.65 wt.-% or ≥0.45 wt.-% to ≤0.65 wt.-% or ≥0.45 wt.-% to ≤0.60 wt.-%. The amount of (C) is in each case based on the total weight of the CMP composition. In an embodiment, the amount of (C) in the CMP composition is ≥0.45 wt.-% to ≤0.55 wt.-% based on the total weight of the CMP composition.

During polishing of a substrate, metal ions of the polished surface get into the polishing solution. These metal ions may form complexes with the CMP composition, thereby leading to ineffective polishing of the substrate. Therefore, a corrosion inhibitor is added to the CMP composition, which reacts with the substrate instead of acting as classical complexing/chelating agent by reacting with the metal ions in solution in forming metal complexes. The CMP composition according to the present subject matter comprises at least one corrosion inhibitor (E).

Preferably, the at least one corrosion inhibitor (E) may be phthalic acid, 4-sulfophthalic acid, 4-hydroxyphthalic acid, 3-aminophthalic acid, 4-aminophthalic acid, 4-methylphthalic acid, 4-methoxyphthalic acid, 3,3,4,4-benzophenonetetracarboxylic acid, 5-aminoisophthalic acid, isophthalic acid, 1,3,5-benzenetricarboxylic acid, 5-hydroxyisophthalic acid, 5-methylisophthalic acid, 1,2,3-benzenetricarboxylic acid hydrate, 4-hydroxyisophthalic acid, 5-methoxyisophthalic acid, 4-methoxyisophthalic acid, (1,1,2,1)terphenyl-3,5-dicarboxylic acid, 1,2,4,5-benzenetetracarboxylic acid, terephthalic acid, 1,2,4-benzenetricarboxylic acid, 2-aminoterephthalic acid, 9,10-anthracenedicarboxylic acid, benzenepentacarboxylic acid, mellitic acid, 2,5-dihydroxyterephthalic acid, 2,5-diaminoterephthalic acid, 2,5-dimethyl-terephthalic acid dimethylester, 5,5-carbonylbis-(Trimellitic acid), 3,5-dimethylpyrazole, pyrazole, 5-methyl-1H-pyrazole-3-carboxylic acid, 1-methylpyrazole, 1,3,5-trimethyl-1H-pyrazole-4-carboxylic acid, 3-methyl-1-phenyl-1H-pyrazole, 3,5-dimethyl-1-phenylpyrazole, 5-amino-3-methyl-1-phenylpyrazole, 1-phenyl-1H-pyrazole-5-carboxylic acid, 5-phenyl-1H-pyrazole-3-carboxylic acid, 3,5-diphenylpyrazole, 5-amino-1-methyl-1H-pyrazole, 3-methylpyrazole, 3-amino-5-phenylpyrazole, 3-pyrazolecarboxylic acid, 3-aminopyrazole, 3-amino-5-ethyl-1H-pyrazole, 1-methyl-1H-pyrazol-3-amine, 3(5)-phenyl-1H-pyrazole, 4,6-dihydroxypyrazolo[3,4-d]pyrimidine, 3,5-pyrazoledicarboxylic acid monohydrate, 1,3-dimethyl-1H-pyrazol-5-amine, 5-amino-1-ethylpyrazole, ethyl 3-methyl-1H-pyrazole-5-carboxylate, 1,3-diphenyl-1H-pyrazol-5-amine, ethyl 1,5-dimethyl-1H-pyrazole-3-carboxylate, 1,3-dimethyl-1H-pyrazole-5-carboxylic acid, 1,5-dimethyl-1H-pyrazole-3-carboxylic acid, dimethyl pyrazolo[1,5-a]pyridine-2,3-dicarboxylate, 1-methyl-1H-pyrazole-4-carboxylic acid, 3-amino-5-hydroxypyrazole, 3-amino-4-carbethoxypyrazole, 4-methylpyrazole, 1-methyl-3-phenyl-1H-pyrazol-5-amine, 1-methyl-5-phenyl-1H-pyrazole-3-carboxylic acid, 1-methyl-3-phenyl-1H-pyrazole-5-carboxylic acid, methyl 1H-pyrazole-3-carboxylate, 1-methyl-1H-pyrazole-5-carboxylic acid, ethyl 5-amino-1-phenyl-1H-pyrazole-4-carboxylate, pyrazolo[1,5-a]pyridine-3-carboxylic acid, 4-(1H-pyrazol-1-yl)aniline, 5-amino-1-methyl-1H-pyrazole-4-carboxamide, 1-methyl-1H-pyrazole-3-carboxylic acid, pyrazolo[1,5-a]pyrimidine-3-carboxylic acid, 3-(4-methoxyphenyl)pyrazole, 1,3,5-trimethyl-1H-pyrazol-4-amine, 3-(5-methyl-1H-pyrazol-4-yl)propylamine, ethyl 5-amino-1-methylpyrazole-4-carboxylate, 3-methyl-1H-pyrazol-5-amine, 2-methyl-2H-indazole-3-carboxylic acid, ethyl 3,5-dimethyl-1H-4-pyrazol ecarboxylate, ethyl 4-pyrazol ecarboxylate, diethyl pyrazole-3,5-dicarboxylate, 4-pyrazolecarboxylic acid, 6-amino-2-methyl-2H-indazole, 1-ethyl-3-methyl-1H-pyrazole-5-carboxylic acid, 4-(3,5-dimethyl-1H-pyrazol-1-yl)aniline, 4-[3,5-di(tert-butyl)-1H-pyrazol-1-yl]aniline, 2-(1H-pyrazol-1-yl)benzoic acid, (1,3-dimethyl-1H-pyrazol-5-yl)methanol, (3,5-dimethyl-1-phenyl-1H-pyrazol-4-yl)methanol, 3,5-dimethyl-1-phenyl-1H-pyrazole-4-carboxylic acid, pyrazolo[1,5-a]pyridine-2-carboxylic acid, 5-amino-3-(4-methylphenyl)pyrazole, 4-(3,5-dimethyl-1H-pyrazol-1-yl)benzoic acid, 4-ethyl hydrogen 1-methyl-1H-pyrazole-4,5-dicarboxylate, 3-amino-5-tert-butyl-1H-pyrazole, (1-methyl-1H-pyrazol-5-yl)methanol, (1-methyl-1H-pyrazol-3-yl)methanol, 7-amino-2-methylindazole, 5-methyl-1-phenyl-1H-pyrazole-4-carboxylic acid, 3-(2-furyl)-1H-pyrazol-5-amine, 1-benzyl-3-(tert-butyl)-1H-pyrazole-5-carboxylic acid, ethyl 3-(2-furyl)-1-methyl-1H-pyrazole-5-carboxylate, 1-methyl-5-phenyl-1H-pyrazole-4-carboxylic acid, 5-(2-furyl)-1-methyl-1H-pyrazole-3-carboxylic acid, 3,5-dimethyl-1H-pyrazole-4-carboxylic acid, 5-(2-furyl)-1H-pyrazole-3-carboxylic acid, 1-phenyl-5-propyl-1H-pyrazole-4-carboxylic acid, 3-(tert-butyl)-1-methyl-1H-pyrazol-5-amine, 3-cyclopropyl-1-methyl-1H-pyrazol-5-amine, histamine, caffeine, theophylline, xanthine, L-histidine, guanine, theobromine, urocanic acid, guanosine, imidazo[1,2-a]pyridine, imidazole, benzimidazol L-carnosine, 5-aminoimidazole-4-carboxamide, 7-(2,3-sihydroxypropyl)theophylline, 1,1'-carbonyldiimidazole, 4,5-imidazoledicarboxylic acid, N-methylimidazole, 4-phenyl-1H-imidazole, 2-phenylimidazole, N-[2-(1H-imidazol-4-yl)ethyl]acetamide, 2-methylimidazole, imidazo[1.2-b]pyridazine, 4-methylimidazole, 2'-deoxyinosine, 2,4-dimethylimidazole, 2-ethylimidazole, 1H-imidazole-4-carboxylic acid, 3-methylxanthine, 1,2-dimethylimidazole, 1-acetylimidazole, 5-aminoimidazole-4-carboxamide-1-beta-D-ribofuranoside, dimethyl 4,5-imidazoledicarboxylate, 1-benzylimidazole, 1-dodecylimidazole, N-(3-aminopropyl)imidazole, imidazo[1,2-a]pyridine-3-carboxylic acid, 1-phenylimidazole, 4-(imidazol-1-yl)phenol, 1H-imidazole-2-carboxylic acid, 1-methyl-1H-imidazole-4-carboxylic acid methyl ester, methyl 1-methyl-1H-imidazole-5-carboxylate, (1-methyl-1H-imidazol-4-yl)methanol, methyl 4-imidazolecarboxylate, (1-methyl-1H-imidazol-2-yl)methanol, 4-(1H-imidazol-1-yl)benzoic acid, nalpha-BOC-L-Histidine, 1,1'-oxalyldiimidazole, 3-(1H-imidazol-1-yl)propanoic acid, 2-amino-7-ethyl-1,7-dihydro-6H-purin-6-one, 1-methyl-1H-imidazole-2-carboxylic acid, 2-methylimidazo[1,2-a]pyridine-3-carboxylic acid, 2-(1H-imidazol-1-yl)benzylamine, 2-(1H-imidazol-1-yl)aniline, 2-(2-methyl-1H-imidazol-1-yl)aniline, 3-isobutyl-1-methylxanthine, 1-allylimidazole, 2-isopropylimidazole, 1-methyl-1H-imidazole-4-carboxylic acid, 1-methyl-1H-imidazole-5-carboxylic acid, ethyl 4-methyl-5-imidazolecarboxylate, 4-(1H-imidazol-1-ylmethyl)aniline, acycloguanosine, imidazo[1,2-a]pyridine-2-carboxylic acid monohydrate, (2-butyl-1H-imidazol-4-yl)methanol, (2-butyl-1H-imidazol-4-yl)methanol, 4-(2-methyl-1H-imidazol-1-yl)aniline, 2-phenyl-1H-imidazole-4-carboxylic acid 1.5 hydrate, imidazo[1,2-a]pyridin-2-ylmethanol, [4-(1H-imidazol-1-yl)phenyl]methanol, [4-(1H-imidazol-1-ylmethyl)phenyl]methanol, imidazo[1,2-a]pyridine-6-carbonitrile, 3-(1H-imidazol-1-yl)benzoic acid, N-alpha-FMOC-N-Trityl-L-histidine, 4-(1H-imidazol-1-ylmethyl)benzonitrile, 3-(1H-imidazol-1-ylmethyl)aniline, 1,2-dimethyl-1H-imidazole-5-carboxylic acid, tetrazole, 5-phenyltetrazole, 5-aminotetrazol, 5-(aminomethyl) tetrazol, 1-propyl 5-amino tetrazol, 1-butyl 5-amino tetrazol, 3-(1H-tetrazol-1-yl)propanoic acid, (5-amino-1H-tetrazol-1-yl)acetic acid, 4-(1H-tetrazol-1-ylmethyl)benzoic acid, ethyl (5-amino-1H-tetrazol-1-yl)acetate, ethyl 1H-tetrazole-5-acetate, 5-(4-methylphenyl)-1H-tetrazole, 4-(1H-tetrazol-5-ylmethyl)phenol, 4-[(5-methyl-1H-tetrazol-1-yl)methyl]benzoic acid, 4-(1H-tetrazol-5-yloxy)aniline, 3-(1H-tetrazol-5-yl)benzyl alcohol, 4-(1H-tetrazol-5-yl)piperidine, 2-(1H-tetrazol-1-yl)aniline, 1-allyl-N-benzyl-1H-tetrazol-5-amine, 2-(1H-tetrazol-5-yl)-phenylamine, 3-(1H-tetraazol-1-yl)phenol, pentylenetetrazole, (5-methyl-1H-tetrazol-1-yl)(phenyl)acetic acid, 2-amino-4-(1H-tetraazol-5-yl)benzoic acid, 3-methoxy-5-(1H-tetrazol-1-yl)aniline, 3-phenyl-2-tetrazol-1-yl-propionic acid, 4-(5-methyl-1H-tetrazol-1-yl)aniline, 3-(5-Methyl-1H-tetrazol-1-yl)aniline, 3-(1H-tetraazol-1-yl) benzoic acid, 4-(5-methyl-1H-tetrazol-1-yl)phenol, 2-hydroxy-5-(1H-tetrazol-1-yl)benzoic acid, 3-(5-methyl-1H-tetraazol-1-yl)phenol, 3-(5-p-tolyl-tetrazol-1-yl)-propionic acid, 5-(3-pyridyl)-1H-tetrazole, 5-(2-pyridyl)-1H-tetrazole, [4-(5-methyl-1H-tetraazol-1-yl)phenyl]acetic acid, 3-(1H-tetraazol-1-yl)-1H-pyrazole-4-carboxylic acid, (5-amino-1H-tetraazol-1-yl)acetic acid, (5-methyl-1H-tetraazol-1-yl)(phenyl)acetic acid, [4-(5-methyl-1H-tetraazol-1-yl)phenyl]acetic acid, 1-allyl-N-benzyl-1H-tetraazol-5-amine, 1H-tetrazole-5-acetic acid, 2-(1H-tetrazol-1-yl)aniline, 2-(1H-tetrazol-5-yl)-phenylamine, 2-amino-4-(1H-tetraazol-5-yl)benzoic acid, 2-hydroxy-5-(1H-tetrazol-1-yl)benzoic acid, 3-(1H-tetraazol-1-yl)-1H-pyrazole-4-carboxylic acid, 3-(1H-tetraazol-1-yl)benzoic acid, 3-(1H-tetraazol-1-yl)phenol, 3-(1H-tetraazol-5-yl)benzyl alcohol, 3-(5-methyl-1H-tetraazol-1-yl)phenol, 3-(5-p-tolyl-tetrazol-1-yl)-propionic acid, 3-phenyl-2-tetrazol-1-yl-propionic acid, 4-(1H-tetrazol-1-ylmethyl)benzoic acid, 4-(1H-Tetrazol-5-yl) piperidine, 4-(1H-tetrazol-5-ylmethyl)phenol, 4-(5-methyl-1H-tetrazol-1-yl)aniline, 4-(5-methyl-1H-tetrazol-1-yl)phenol, 4-[(5-methyl-1H-tetrazol-1-yl)methyl]benzoic acid, ethyl (5-amino-1H-tetrazol-1-yl)acetate, ethyl 1H-tetrazole-5-acetate, 2-phenyl-3-[4-(1H-1,2,3,4-tetraazol-5-yl)benzyl]-4H-chromen-4-one, 2-phenyl-3-[4-(1H-1,2,3,4-tetraazol-5-yl)benzylidene]chroman-4-one, 4-ethyl-5-(1-phenyl-1H-1,2,3,4-tetraazol-5-yl)pyrimidin-2-amine, 6-phenyl-5,6-dihydrobenzo[f][1,2,3,4]tetraazolo[1,5-d][1,4]oxazepine, 4-ethyl-5-[1-(4-methylphenyl)-1H-1,2,3,4-tetraazol-5-yl] pyrimidin-2-amine, 5-[1-(4-methylphenyl)-1H-1,2,3,4-tetraazol-5-yl]-4-propylpyrimidin-2-amine, 4-methyl-3-[1-(4-methylphenyl)-1H-1,2,3,4-tetraazol-5-yl]quinolone, 4-methyl-3-(1-phenyl-1H-1,2,3,4-tetraazol-5-yl)quinolone, N1-benzyl-2-(1-phenyl-1H-1,2,3,4-tetraazol-5-yl)eth-1-en-1-amine, N1,N1-diethyl-2-[1-(4-methylphenyl)-1H-1,2,3,4-tetraazol-5-yl]eth-1-en-1-amine, methyl 2-{[2-(1-phenyl-1H-1,2,3,4-tetraazol-5-yl)vinyl]amino}benzoate, 2,4-diphenyl-5-(1-phenyl-1H-1,2,3,4-tetraazol-5-yl)pyrimidine, 5-[1-(4-methylphenyl)-1H-1,2,3,4-tetraazol-5-yl]-2,4-diphenylpyrimidine, 1-[4-(tertbutyl)phenyl]-5-phenyl-1H-1,2,3,4-tetraazole, N2-methyl-4-phenyl-5-(1-phenyl-1H-1,2,3,4-tetraazol-5-yl)pyrimidin-2-amine, 3,5-di(acetyloxy)-2-[(acetyloxy)methyl]-6-(1H-1,2,3,4-tetraazol-5-yl) tetrahydro-2H-pyran-4-yl acetate, 3-{5-[4-(tert-butyl) phenyl]-1H-1,2,3,4-tetraazol-1-yl}pyridine, 7-methyl-5-phenyl[1,2,3,4]tetraazolo[1,5-a]pyrimidine, 5-methyl-N-(1H-1,2,3,4-tetraazol-5-yl)-2-pyrazinecarboxamide, 5-methyl-3-[1-(4-methylphenyl)-1H-1,2,3,4-tetraazol-5-yl]-1H-indole, 3-[1-(4-methoxyphenyl)-1H-1,2,3,4-tetraazol-5-yl]-5-methyl-1H-indole, 2,3-di(acetyloxy)-1-[1,2-di(acetyloxy)ethyl]-3-(1H-1,2,3,4-tetraazol-5-yl)propyl acetate, 2,3-di(acetyloxy)-1-[1,2-di(acetyloxy)ethyl]-3-(1H-1,2,3,4-tetraazol-5-yl)propyl acetate, 3-[1-(4-methylphenyl)-1H-1,2,3,4-tetraazol-5-yl]-1,4-dihydroquinolin-4-one, 3-(1-phenyl-1H-1,2,3,4-tetraazol-5-yl)-1,4-dihydroquinolin-4-one, 3-(dimethylamino)-1-(4-methyl phenyl)-2-(1-phenyl-1H-1,2,3,4-tetraazol-5-yl)prop-2-en-1-one, 3-(dimethylamino)-1-(2-methylphenyl)-2-(1-phenyl-1H-1,2,3,4-tetraazol-5-yl)prop-2-en-1-one, ethyl 2-({2-[1-(4-methylphenyl)-1H-1,2,3,4-tetraazol-5-yl]vinyl}amino)benzoate, N-methyl-N-(2-{methyl[2-(1-phenyl-1H-1,2,3,4-tetraazol-5-yl)vinyl]amino}ethyl)-N-[2-(1-phenyl-1H-1,2,3,4-tetraazol-5-yl)vinyl]amine, 4-methyl-sulfonyl benzoic acid, 3-methylamino benzoic acid, 4-(diethylamino)benzoic acid, 3-dimethylamino benzoic acid, 2 (benzylamino)benzoic acid, 4-methylamino benzoic acid, 4-(dimethylamino) benzoic acid, N-oleoylsarcosine, N-lauroylsarcosine, N-cocoylsarcosine, N-cocoylglutamate, 4-dodecylbenzene sulfonic acid, toluene sulfonic acid, tetrapropylenbenzolsulfonat, phosphoric acid hexyl ester, phosphoric acid alkyl ester (C6-C10), ([iminobis(methylen)]bisphosphonic acid, N-coco-alkyl derivates), ([iminobis(methylen)]bisphosphonic acid, N-coco-alkyl derivates)-N-oxide, 6,6',6"-(1,3,5-triazine-2,4,6-triyltriimino)trihexanoic acid, 2,4,6-trimethylmelamine, pentamethylmelamine, {[bis(dimethylamino)-1,3,5-triazin-2-yl)](methyl)amino}methanol, ({bis[(hydroxymethyl)amino)]-1,3,5-triazin-2-yl}amino) methanol, 2,4-diamino-6-diallylamino-1,3,5-triazine, ({bis[bis(hydroxyl-methyl)amino]-1,3,5-triazin-2-yl}(hydroxyl-methyl)amino)methanol, N2,N4-di-tert-butyl-1,3,5-triazine-2,4,6-triamine, N2,N4-bis(prop-2-en-1-yl)-1,3,5-triazine-2,4,6-triamine, polyaspartate and mixtures and salts thereof.

More preferably the at least one corrosion inhibitor (E) is selected from the group consisting of imidazole, benzimidazole, benzotriazole, 4-(dimethylamino) benzoic acid, terephthalic acid, isophthalic acid, 6,6',6"-(1,3,5-triazine-2,4,6-triyltriimino)trihexanoic acid, phenyltetrazole, N-lauroylsarcosine, 4-dodecylbenzene sulfonic acid, phosphoric acid C6-C10 alkyl ester, polyaspartate and mixtures and salts thereof.

Even more preferably the at least one corrosion inhibitor (E) is selected from the group consisting of benzotriazole, 4-(dimethylamino) benzoic acid, terephthalic acid, isophthalic acid, 6,6',6"-(1,3,5-triazine-2,4,6-triyltriimino)trihexanoic acid, phenyltetrazole, N-lauroylsarcosine, 4-dodecylbenzene sulfonic acid, phosphoric acid C6-C10 alkyl ester, polyaspartate and mixtures and salts thereof.

Most preferably the at least one corrosion inhibitor (E) is selected from the group consisting of benzotriazole, isophthalic acid, 6,6',6"-(1,3,5-triazine-2,4,6-triyltriimino)trihexanoic acid, phenyltetrazole, N-lauroylsarcosine, 4-dodecylbenzene sulfonic acid, phosphoric acid C6-C10 alkyl ester, polyaspartate and mixtures and salts thereof. In an embodiment, the at least one corrosion inhibitor (E) is selected from the group consisting of benzotriazole, N-lauroylsarcosine, 4-dodecylbenzene sulfonic acid, polyaspartate and mixtures and salts thereof.

The at least one corrosion inhibitor (E) has a pKa-value of below 8.50, more preferably of below 8.45, most preferably of below 8.35. In an embodiment, the at least one corrosion inhibitor (E) has a pKa-value of below 8.30.

The amount of at least one corrosion inhibitor (E) in the CMP composition is ≥0.01 wt.-% to ≤0.50 wt.-% based on the total weight of the CMP composition. Preferably, the amount of (E) is ≥0.01 wt.-% to ≤0.45 wt.-%. More preferably the amount of (E) is ≥0.02 wt.-% to ≤0.35 wt.-%, even more preferably the amount of (E) is ≥0.02 wt.-% to ≤0.30 wt.-%. Most preferably the amount of (E) is ≥0.02 wt.-% to ≤0.25 wt.-% or ≥0.03 wt.-% to ≤0.20 wt.-% or ≥0.03 wt.-% to ≤0.15 wt.-%. The amount of (E) is in each case based on the total weight of the CMP composition. In an embodiment, the amount of (E) in the CMP composition is ≥0.03 wt.-% to ≤0.1 wt.-% based on the total weight of the CMP composition.

The CMP composition may further comprise at least one additive (K) selected from the group consisting of surfactants (F), biocides (H), pH adjusting agents, buffer substances, stabilizers and friction reducing agents. Such additives are known to a person skilled in the art. The amount of at least one additive (K) in the CMP composition is ≥0.01 wt.-% to ≤1.50 wt.-% based on the total weight of the CMP composition. Preferably, the amount of at least one additive (K) is ≥0.01 wt.-% to ≤1.30 wt.-%, more preferably the amount of (K) is ≥0.01 wt.-% to ≤1.10 wt.-%, even more preferably the amount of (K) is ≥0.01 wt.-% to ≤1.00 wt.-%, or ≥0.01 wt.-% to ≤0.90 wt. %, or ≥0.01 wt.-% to ≤0.70 wt.-%. Most preferably the amount of (K) is ≥0.01 wt.-% to ≤0.50 wt.-% or ≥0.01 wt.-% to ≤0.30 wt.-% or ≥0.01 wt.-% to ≤0.20 wt.-%. The amount of (K) is in each case based on the total weight of the CMP composition.

Surfactant (F), when selected as at least one additive (K) in the CMP composition, is a surface active compound which decreases the surface tension of a liquid, the interfacial tension between two liquids, or that between a liquid and a solid. Preferable, the surfactant (F) may be any nonionic surfactant (F). Such non-ionic surfactant (F) is preferably water-soluble and/or water-dispersible, more preferably water-soluble. By the term "water-soluble", it is meant that the relevant component or ingredient of the composition of the present subject matter may be dissolved in the aqueous phase on the molecular level. However, the term "water-dispersible" means that the relevant component or ingredient of the composition of the present subject matter may be dispersed in the aqueous phase and forms a stable emulsion or suspension.

The non-ionic surfactant (F) is preferably an amphiphilic non-ionic surfactant, i.e. a surfactant which comprises at least one hydrophobic group (b1) and at least one hydrophilic group (b2). This means that the non-ionic surfactant (F) may comprise more than one hydrophobic group (b1), e.g., 2, 3 or more groups (b1), which are separated from each other by at least one hydrophilic group (b2), as described hereinbelow. The non-ionic surfactant (F) may also comprise more than one hydrophilic group (b2), e.g., 2, 3 or more groups (b2) which are separated from each other by hydrophobic groups (b1), as hereinbelow described.

Therefore, the non-ionic surfactant (F) may have different block-like general structures. Examples of such general block-like structures are, such as but not limited to:

b1-b2,
b1-b2-b1,
b2-b1-b2,
b2-b1-b2-b1,
b1-b2-b1-b2-b1, and
b2-b1-b2-b1-b2.

The non-ionic surfactant (F) is more preferably an amphiphilic non-ionic surfactant comprising a polyoxyalkylene group.

The hydrophobic group (b1) is preferably an alkyl group, more preferably an alkyl group having 4 to 40 carbon atoms, or even more preferably having 5 to 20 carbon atoms, or 7 to 18 carbon atoms, or 10 to 16 carbon atoms. Most preferably the hydrophobic group (b1) is an alkyl group having 11 to 14 carbon atoms.

The hydrophilic group (b2) is preferably a polyoxyalkylene group. Said polyoxyalkylene groups may be oligomeric or polymeric. More preferably, the hydrophilic group (b2) is a hydrophilic group selected from the group consisting of polyoxyalkylene groups comprising:

(b21) oxyalkylene monomer units, and
(b22) oxyalkylene monomer units other than oxyethylene monomer units, said monomer units (b21) being not identical to monomer units (b22), and said polyoxyalkylene group of (b2) containing the monomer units (b21) and (b22) in random, alternating, gradient and/or block-like distribution.

Most preferably, the hydrophilic group (b2) is a hydrophilic group selected from the group consisting of polyoxyalkylene groups comprising:

(b21) oxyethylene monomer units, and
(b22) oxyalkylene monomer units other than oxyethylene monomer units, said polyoxyalkylene group of (b2) containing the monomer units (b21) and (b22) in random, alternating, gradient and/or block-like distribution.

Preferably, the oxyalkylene monomer units other than oxyethylene monomer units (b22) are substituted oxyalkylene monomer units wherein the substituents are selected from the group consisting of alkyl, cycloalkyl, aryl, alkyl-cycloalkyl, alkyl-aryl, cycloalkyl-aryl and alkyl-cycloalkyl-aryl groups. The oxyalkylene monomer units other than oxyethylene monomer units (b22) are

- more preferably derived from substituted oxiranes (X) wherein the substituents are selected from the group consisting of alkyl, cycloalkyl, aryl, alkyl-cycloalkyl, alkyl-aryl, cycloalkyl-aryl and alkyl-cycloalkyl-aryl groups,
- most preferably derived from alkyl-substituted oxiranes (X),
- particularly preferably derived from substituted oxiranes (X) wherein the substituents are selected from the group consisting of alkyl groups having 1 to 10 carbon atoms, In an embodiment, the oxyalkylene monomer units other than oxyethylene monomer units (b22) are derived from methyl oxirane (propylene oxide) and/or ethyl oxirane (butylene oxide).

The substituents of the substituted oxiranes (X) themselves may also carry inert substituents, i.e. substituents which do not adversely affect the copolymerization of the oxiranes (X) and the surface activity of the non-ionic surfactants (F). Examples of such inert substituents are fluorine and chlorine atoms, nitro groups and nitrile groups. If such inert substituents are present, they are used in such amounts that they do not adversely affect the hydrophilic-hydrophobic balance of the non-ionic surfactant (F). Preferably, the substituents of the substituted oxiranes (X) do not carry such inert substituents.

The substituents of the substituted oxiranes (X) are preferably selected from the group consisting of alkyl groups having 1 to 10 carbon atoms, cycloalkyl groups having 5 to 10 carbon atoms in spirocyclic, exocyclic and/or annealed configuration, aryl groups having 6 to 10 carbon atoms, alkyl-cycloalkyl groups having 6 to 20 carbon atoms, alkyl-aryl groups having 7 to 20 carbon atoms, cycloalkyl-aryl group 11 to 20 carbon atoms, and alkyl-cycloalkyl-aryl groups having 12 to 30 carbon atoms. Most preferably, the substituents of the substituted oxiranes (X) are selected from the group consisting of alkyl groups having 1 to 10 carbon atoms. Particularly, the substituents of the substituted oxiranes (X) are selected from the group consisting of alkyl groups having 1 to 6 carbon atoms.

In an embodiment, the most preferred substituted oxiranes (X) are methyl oxirane (propylene oxide) and/or ethyl oxirane (butylene oxide), particularly methyl oxirane.

Most preferably, the hydrophilic group (b2) consists of the monomer units (b21) and (b22).

In another embodiment, the hydrophilic group (b2) is preferably a polyoxyethylene, polyoxypropylene or polyoxybutylene group, more preferably a polyoxyethylene group.

In case that the hydrophilic group (b2) comprises or consists of the monomer units (b21) and (b22), the polyoxyalkylene group—acting as hydrophilic group (b2)—contains the monomer units (b21) and (b22) in random, alternating, gradient and/or block-like distribution. This means, that one hydrophilic group (b2) may have only one type of distribution, i.e.

random: . . . -b21-b21-b22-b21-b22-b22-b22-b21-b22- . . . ;
alternating: . . . -b21-b22-b21-b22-b21- . . . ;
gradient: . . . b21-b21-b21-b22-b21-b22-b22-b21-b22-b22-b22- . . . ; or
block-like: . . . -b21-b21-b21-b22-b22-b22-b22- . . . .

Alternatively, the hydrophilic group (b2) may also contain at least two types of distributions, e.g., an oligomeric or polymeric segment having a random distribution and an oligomeric or polymeric segment having alternating distribution. Most preferably, the hydrophilic group (b2) preferably has only one type of distribution, and most preferably, said distribution is random or block-like.

In the embodiments where the hydrophilic group (b2) comprises or consists of the monomer units (b21) and (b22), the molar ratio of (b21) to (b22) may vary broadly and, therefore, may be adjusted most advantageously to the particular requirements of the composition, the process and the use of the present subject matter. Preferably the molar ratio (b21):(b22) is from 100:1 to 1:1, more preferably, from 60:1 to 1.5:1 and, most preferably, from 50:1 to 1.5:1, and particularly preferably, from 25:1 to 1.5:1, and particularly, from 15:1 to 2:1, and for example, from 9:1 to 2:1.

Also the degree of polymerization of the oligomeric and polymeric polyoxyalkylene groups—acting as hydrophilic groups (b2)—may vary broadly and, therefore, may be adjusted most advantageously to the particular requirements of the composition, the process and the use of the present subject matter. Preferably, the degree of polymerization is in the range of from 5 to 100, preferably 5 to 90, and most preferably, 5 to 80.

Particularly, the non-ionic surfactant (F) is an amphiphilic non-ionic polyoxyethylene-polyoxypropylene alkyl ether surfactant which is a mixture of molecules containing, on an average, an alkyl group having 10 to 16 carbon atoms and 5 to 20 oxyethylene monomer units (b21) and 2 to 8 oxypropylene monomer units in random distribution. In an embodiment, the non-ionic surfactant (F) is an amphiphilic non-ionic polyoxyethylene-polyoxypropylene alkyl ether surfactant which is a mixture of molecules containing, on the average, an alkyl group having 11 to 14 carbon atoms and 12 to 20 oxyethylene monomer units and 3 to 5 oxypropylene monomer units in random distribution.

The amount of non-ionic surfactant (F), if present, may be $\geq 0.01$ wt.-% to $\leq 1.30$ wt.-%, more preferably the amount of (F) is $\geq 0.01$ wt.-% to $\leq 1.10$ wt.-%, even more preferably the amount of (F) is $\geq 0.01$ wt.-% to $\leq 1.00$ wt.-%, or $\geq 0.01$ wt.-% to $\leq 0.90$ wt.-% or $\geq 0.01$ wt.-% to $\leq 0.70$ wt. %. Most preferably the amount of (F) is $\geq 0.01$ wt.-% to $\leq 0.50$ wt.-% or $\geq 0.01$ wt.-% to $\leq 0.30$ wt.-% or $\geq 0.01$ wt.-% to $\leq 0.20$ wt.-% or $\geq 0.01$ wt.-% to $\leq 0.10$ wt.-% or $\geq 0.01$ wt.-% to $\leq 0.08$ wt.-% or $\geq 0.01$ wt.-% to $\leq 0.05$ wt.-%. The amount of (F) is in each case based on the total weight of the CMP composition. In an embodiment, the amount of non-ionic surfactant (F) in the CMP composition is $\geq 0.01$ wt.-% to $\leq 0.03$ wt.-% based on the total weight of the CMP composition.

The non-ionic surfactant (F) may have different weight average molecular weights. The weight average molecular weight of (F) is preferably at least 300, more preferably at least 500, most preferably at least 700, particularly at least 800, for example at least 900. The weight average molecular weight of (F) is preferably not more than 15,000, more preferably not more than 6,000, most preferably not more than 3,000, particularly not more than 2,000, for example not more than 1,400 [g/mol], as determined by gel permeation chromatography (abbreviated as GPC). In particular, the weight average molecular weight of (F) is from 900 to 1,400 [g/mol] as determined by GPC. Said GPC are standard GPC techniques known to a person skilled in the art.

The solubility of non-ionic surfactant (F) in an aqueous medium may vary within a wide range. The solubility of (F) in water at pH 7 at 25° C. under atmospheric pressure is preferably at least 1 g/L, more preferably at least 5 g/L, most preferably at least 20 g/L, even more preferably at least 50 g/L or 150 g/L.

Biocides (H), if present as at least one additive (K), may be at least one biocide (H). A biocide is a compound which deters, renders harmless, or exerts a controlling effect on any harmful organism by chemical or biological means. Preferably, (H) is a quaternary ammonium compound, an isothiazolinone-based compound, an N-substituted diazenium dioxide, or an N'-hydroxy-diazenium oxide salt. More preferably, (H) is an N-substituted diazenium dioxide, or an N'-hydroxydiazenium oxide salt.

The amount of biocide (H) in the CMP composition may be ≥0.00 wt.-% to ≤1.30 wt.-%, more preferably the amount of (H) is ≥0.00 wt.-% to ≤1.10 wt.-%, even more preferably the amount of (H) is ≥0.00 wt.-% to ≤1.00 wt.-%, or ≥0.00 wt.-% to ≤0.90 wt.-% or ≥0.00 wt.-% to ≤0.70 wt. %. Most preferably the amount of (H) is ≥0.00 wt.-% to ≤0.50 wt.-% or ≥0.00 wt.-% to ≤0.30 wt.-% or ≥0.00 wt.-% to ≤0.20 wt.-% or ≥0.00 wt.-% to ≤0.10 wt.-% or ≥0.00 wt.-% to ≤0.08 wt.-% or ≥0.00 wt.-% to ≤0.05 wt.-%. The amount of (H) is in each case based on the total weight of the CMP composition.

Other additives which may be optionally present as at least one additive (K) may be pH adjusting agents, buffer substances, stabilizers and friction reducing agents. Such additives are well-known to a person skilled in the art. The amount of these additives in the CMP composition may be ≥0.00 wt.-% to ≤1.00 wt.-%, more preferably the amount is ≥0.00 wt.-% to ≤0.90 wt.-% or ≥0.00 wt.-% to ≤0.70 wt.-%. Most preferably the amount is ≥0.00 wt.-% to ≤0.50 wt.-% or ≥0.00 wt. % to ≤0.30 wt.-% or ≥0.00 wt.-% to ≤0.20 wt.-% or ≥0.00 wt.-% to ≤0.10 wt.-% or ≥0.00 wt. % to ≤0.08 wt.-% or ≥0.00 wt.-% to ≤0.05 wt.-%. The amount of other additives as at least one additive (K) is in each case based on the total weight of the CMP composition.

The major component of the CMP composition of the present subject matter is an aqueous medium (D). The aqueous medium (D) may be of one type or a mixture of different types of aqueous media. In general, the aqueous medium (D) may be any medium which contains water. Preferably, the aqueous medium (D) is a mixture of water and an organic solvent miscible with water e.g. an alcohol, preferably a $C_1$ to $C_3$ alcohol, or an alkylene glycol derivative. More preferably, the aqueous medium (D) is water. Most preferably, the aqueous medium (D) is de-ionized water.

If the amounts of the components other than (D) are in total 'x' wt.-% based on the total weight of the CMP composition, then the amount of (D) is '(100-x)' wt.-% based on the total weight of the CMP composition. In an embodiment, the amount of aqueous medium (D) in the CMP composition may be ≥95.00 wt.-% to ≤99.58 wt.-% based on the total weight of the CMP composition.

The properties of the CMP composition, such as stability, polishing performance and etching behavior of the composition as against different materials, for example metals vs. silicon dioxide, may depend on the pH of the corresponding composition. The pH of the CMP composition may be adjusted in any suitable manner by adding a pH adjuster to the composition. Suitable pH adjusters may include, such as but not limited to, potassium hydroxide, ammonium hydroxide, sodium carbonate, and mixtures thereof.

Accordingly, the CMP composition has a pH of ≥8.5 to ≤11.0. Preferably, the pH is ≥9.0 to ≤10.5, more preferably the pH is ≥9.0 to ≤10.3, most preferably the pH is ≥9.0 to ≤10.0.

The CMP composition of the present subject matter is used for chemical mechanical polishing of substrates used in the semiconductor industry, wherein the substrate comprises cobalt and/or a cobalt alloy and TiN and/or TaN.

The cobalt and/or cobalt alloy may be of any type, form, or shape. Such type, form, or shape of the cobalt and/or cobalt alloy are known to a person skilled in the art. However, the cobalt and/or cobalt alloy preferably has the shape of a layer and/or overgrowth. If this cobalt and/or cobalt alloy has the shape of a layer and/or overgrowth, the cobalt and/or cobalt alloy content is preferably more than 90%, more preferably more than 95%, most preferably more than 98%, particularly more than 99%, for example more than 99.9% by weight of the corresponding layer and/or overgrowth. The cobalt and/or cobalt alloy has been preferably filled or grown in trenches or plugs between other substrates, more preferably filled or grown in trenches or plugs in dielectric materials like for example $SiO_2$, silicon, low-k (BD1, BD2) or ultra-low-k materials, or other isolating and semiconducting material used in the semiconductor industry. For instance, in the Through Silicon Vias (abbreviated as TSV) middle process, insolated materials such as polymers, photoresist and/or polyimide can be used as insulating material between the subsequent processing steps of wet etch and CMP for insulating/isolating properties after revealing the TSV from the backside of the wafer. Between the copper comprising and the dielectric material can be a thin layer of a barrier material. Generally, barrier materials to prevent metal ions from diffusing into the dielectric material are Ti/TiN, Ta/TaN or for example Ru or Ru-alloys, Co or Co-alloys. Another application of Cobalt in semiconductor chip manufacturing is the deposition of cobalt by CVD or PVD methods into trenches or vias. The dielectric layer is covered by a liner to make sure that the Co will not delaminate or diffuse into the dielectric layer. As liner and/or barrier a layer of TiN and/or TaN is used.

The CMP composition according to the present subject matter is used for polishing a substrate comprising cobalt and/or cobalt alloy and TiN and/or TaN. The CMP composition provides control over the TiN:TaN ratio of material removal rate (abbreviated as MRR) and the same may be varied in the range of ≥0.5 to ≤2.0. Preferably, the TiN:TaN ratio of MRR is in the range of ≥0.5 to ≤1.8. More preferably the range is ≥0.5 to ≤1.6. Most preferably the range is ≥0.5 to ≤1.4.

Accordingly, the MRR of TiN and TaN may be varied to maintain the ratio, as described hereinabove. Depending on the desired end use of the substrate polished in the presence of the CMP composition of the present subject matter, this ratio may be varied and therefore the corresponding MRR may vary. However, the MRR of TiN is maintained preferably ≥50 to ≤700 Å/min, more preferably it is ≥50 to ≤650 Å/min, most preferably ≥50 to ≤600 Å/min. In an embodiment, the MRR of TiN is 50 to ≤550 Å/min.

The TaN and TiN material removal rates are correlated.

A semiconductor device can be manufactured by a process which comprises the chemical mechanical polishing of a substrate used in the semiconductor industry in the presence of the CMP composition of the present subject matter. According to the present subject matter, said process comprises the chemical mechanical polishing of a substrate comprising cobalt and/or cobalt alloy and TiN and/or TaN.

Generally, the semiconductor device which may be manufactured by the process according to the present subject matter is not particularly limited. The semiconductor device may be an electronic component comprising semiconducting materials, as for example silicon, germanium, and Ill-V materials. Semiconductor devices may be those which are manufactured as single discrete devices or those which are manufactured as integrated circuits (ICs) consisting of a number of devices manufactured and interconnected on a wafer. Semiconductor devices may be two terminal devices such as a diode, three terminal devices such as a bipolar transistor, four terminal devices such as Hall effect sensor or multi-terminal devices. Preferably, said semiconductor device is a multi-terminal device. Multi-terminal devices can be logic devices as integrated circuits and microprocessors or memory devices as random access memory (RAM), read only memory (ROM) and phase change random access memory (PCRAM). Preferably said semiconductor device is a multi-terminal logic device. In particular said semiconductor device is an integrated circuit or microprocessor.

Generally, in integrated circuits cobalt is used as adhesion or barrier layer for copper interconnects. In its nano-crystalline form cobalt is contained for example in memory devices and as metal gate in MOSFET. Cobalt may also be used as a seed to enable plating of copper by electrodeposition. Cobalt or a cobalt alloy may also be used as wiring instead of copper for one or more layers. For example, a capacitor (CAP) may be formed by successive layers of metal, insulator, metal (MIM) and a thin film resistor at the same level. Circuit designers can now wire to the TaN thin film resistor at the lowest metal level, which reduces parasitics and allows more efficient usage of the existing wiring levels. The excess copper and/or cobalt and the adhesion/barrier layer comprising Co in form of, for example metal nitrides or metal carbon nitrides, such as Co/TaN, Co/TiN, Co/TaCN, Co/TiCN, or for example as a single cobalt alloy layer, such as CoMo, CoTa, CoTi and CoW above the dielectrics, can be removed by the chemical mechanical polishing process according to the present subject matter.

Generally, this cobalt and/or cobalt alloy and TiN and/or TaN may be produced or obtained in different ways. Cobalt or cobalt alloys may be produced by ALD, PVD or CVD processes. The cobalt or the cobalt alloy is deposited onto a barrier material of TiN and/or TaN. Proper materials for barrier application are well known in the art. The barrier prevents metal atoms or ions like cobalt or copper from diffusing into the dielectric layer and improves the adhesion properties of the conductive layer.

Generally, this cobalt and/or cobalt alloy can be of any type, form, or shape. This cobalt and/or cobalt alloy preferably has the shape of a layer and/or overgrowth. If this cobalt and/or cobalt alloy has the shape of a layer and/or overgrowth, the cobalt and/or cobalt alloy content is preferably more than 90%, more preferably more than 95%, most preferably more than 98%, particularly more than 99%, for example more than 99.9% by weight of the corresponding layer and/or overgrowth. This cobalt and/or cobalt alloy has been preferably filled or grown in trenches or plugs between other substrates, more preferably filled or grown in trenches or plugs in dielectric materials like for example $SiO_2$, silicon, low-k (BD1, BD2) or ultra-low-k materials, or other isolating and semiconducting material used in the semiconductor industry.

Generally, the down pressure or down force is a downward pressure or a downward force which is applied by the carrier to the wafer pressing it against the pad during CMP. This down pressure or down force can for example be measured in pound per square inch (abbreviated as psi) For example the process of the present subject matter may be performed with a down pressure of 2 psi or lower. Preferably the down pressure is in the range of from 0.1 to 1.9 psi, more preferably in the range of from 0.3 to 1.8 psi, most preferably in the range of from 0.4 to 1.7 psi, particularly preferable in the range of from 0.8 to 1.6 psi, for example 1.5 psi.

Processes for preparing CMP compositions are generally known. These processes may be applied to the preparation of the CMP composition used according to the present subject matter. This can be carried out by dispersing or dissolving the components (A), (B), (C), (E) and (K) in the aqueous medium (D) and by adjusting the pH value, as described hereinabove. For this purpose, the customary and standard mixing processes and mixing apparatuses such as agitated vessels, high shear impellers, ultrasonic mixers, homogenizer nozzles or counterflow mixers, may be used.

The chemical mechanical polishing process is generally known to a person skilled in the art and may be carried out with the processes and the equipment under the conditions customarily used for CMP in the fabrication of wafers with integrated circuits. There is no restriction on the equipment with which the polishing process can be carried out.

As is known in the art, typical equipment for the CMP process consists of a rotating platen which is covered with a polishing pad. Also, orbital polishers have been used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and presents a surface parallel to that of the wafer to be polished. The polishing pad on the platen contacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the present subject matter the CMP composition of the present subject matter is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard-polishing pad is used, because the down pressure distribution on the wafer is more uniform compared to that of a carrier with a hard platen design. Carriers with the option to control the pressure distribution on the wafer may also be used according to the present subject matter. They are usually designed with a number of different chambers that can be loaded to a certain degree independently from each other.

For further details reference is made to WO 2004/063301 A1, in particular page 16, paragraph [0036] to page 18, paragraph [0040] in conjunction with the FIG. 2.

By way of the CMP process of the present subject matter and/or using the CMP composition of the present subject matter, wafers with integrated circuits comprising cobalt and/or cobalt alloy and TiN and/or TaN may be obtained which have an excellent functionality and may be tailor made depending on the requirement.

The CMP composition according to the present subject matter can be used in the CMP process as ready-to-use slurry, they have a long shelf-life and show a stable particle size distribution over long time. Thus, they are easy to handle and to store. They show an excellent polishing performance combined with a controlled MRR of cobalt and/or cobalt alloy and TiN and/or TaN. Since the amounts of the components of the CMP composition are held down to a minimum, the CMP composition of the present subject matter may result in a cost-effective chemical mechanical polishing.

Different values of MRR for cobalt, TiN and/or TaN may be achieved by varying the concentration of different components of the CMP composition.

The CMP composition according to the present subject matter has several advantages over the existing compositions, e.g.:
- control over material removal rates for Co, TiN and/or TaN, and/or
- catering to the requirements of the semiconductor industry/user by varying the TiN:TaN ratio of MRR in the desired range, and/or
- using components of the CMP composition in low amounts, thereby providing a cost-effective and relatively economical composition, and/or
- alkaline pH of the CMP composition prevents corrosion and material deterioration of the substrate.

Examples and Comparative Examples

Standard CMP Process for 200 mm Co Wafers:
Tool: Mirra-mesa (Applied Materials)
down pressure: 1.5 psi;
inner tube pressure 2.5 psi;
retaining ring pressure: 4.0 psi;
polishing table/carrier speed: 93/87 rpm;
slurry flow rate: 200 mL/min;
polishing time: 20 s Co 60 s TEOS, TiN
polishing pad: DOW IC 1010;
conditioning tool: 3M A166 diamond abrasive disk for AMAT CMP machines, in-situ conditioning with 5 lbf down force.

The slurry is stirred in a local supply station.

Standard Analysis Procedure for Film Thickness Measurement:

Cobalt and TiN and TaN film: Resistage RG-120/RT-80, 4 point probe instrument (NAPSON Corporation) TEOS: Opti-Probe 2600 (Therma Wave, KLA-Tencor).

Film thickness is measured pre and post CMP with a 49 point scan (5 mm edge exclusion). The thickness loss is averaged and divided by the polishing time to give the material removal rate (MRR).

Co coated wafers: 2000 A PVD Co on Ti liner (Supplier: AMT);

TiN and TaN: PVD on TEOS

The pH-value is measured with a pH combination electrode (Schott, blue line 22 pH electrode).

Standard Procedure for Slurry Preparation:

All mixing procedures are carried out under stirring. An aqueous stock solution of each compound (B), (E) and (F) is prepared by dissolving the desired amount of the respective compound in (D) ultra-pure water (UPW). For the stock solutions of (B) and (E) KOH may be used to support dissolution. The pH of the stock solution is adjusted to 8 by KOH. The stock solutions of (B) has a concentration of the respective additive of 10 wt.-%, that of (E) and (F) of 1.0 wt.-%. For (A) a dispersion is used as provided by the supplier, typically about 20%-30% abrasive concentration by weight. The oxidizer (C) is used as 30 wt.-% stock solution.

To prepare 1000 g of slurry 600 g of (D) is given into a mixing tank or beaker. The amounts of stock solutions of (B), (E) and (F) are added to reach the desired concentrations. KOH is used to keep the solution at alkaline to neutral pH. Then (A) is added with the necessary amount. To adjust final concentration (D) is added as balance water, with respect to the necessary amount of oxidizer stock solution. The pH is adjusted to the desired value by KOH. The oxidizer is added with the desired amount about 60 min before CMP.

Inorganic Particles (A) Used in the Examples:

Colloidal cocoon-shaped Silica particles (A1) having an average primary particle size (d1) of 35 nm and an average secondary particle size (d2) of 70 nm (as determined using

| | Compounds |
|---|---|
| (A) Inorganic particles | Fuso ® PL3 (cocoon-shaped silica particles available from Fuso Chemical Corporation) |
| (B) Organic compound | (B1) Glycin |
| | (B2) EDTA |
| | (B3) Malonic Acid |
| | (B4) Citric Acid |
| | (B5) Tartaric Acid |
| | (all are available from Sigma-Aldrich) |
| (C) Potassium persulfate | Potassium persulfate (available from Sigma-Aldrich) |
| (D) Aqueous medium | De-ionized water |
| (E) Corrosion inhibitor | (E1) BTA (available from Sigma-Aldrich) |
| | (E2) Perlastan ® L 30 (N-lauroylsarcosine available from Schill + Seilacher GmbH) |
| | (E3) DBS (available from Sigma-Aldrich) |
| | (E4) Baypure ® DS 100 (sodium polyaspartate available from LANXESS Deutschland GmbH) |
| (F) Non-ionic surfactant | Triton ™ DF 16 (available from DOW Chemical Company) | dynamic light scattering techniques via a Horiba instrument) and a specific surface area of around 46 m²/g were used.

TABLE 1

Experimental results of particle shape analysis of cocoon-shaped silica particles (A)

| statistical function | ECD | sphericity | shape factor |
|---|---|---|---|
| unit | Nm | | |
| number of particles | 475 | 475 | 475 |
| average | 53.67 | 0.631 | 0.881 |
| minimum | 33.68 | 0.150 | 0.513 |

TABLE 1-continued

Experimental results of particle shape analysis of cocoon-shaped silica particles (A)

| statistical function | ECD | sphericity | shape factor |
|---|---|---|---|
| maximum | 99.78 | 0.997 | 0.978 |
| standard deviation | 11.69 | 0.199 | 0.083 |
| median d50 | 51.32 | 0.662 | 0.911 |
| d90 | | | 0.955 |

Procedure for Particle Shape Characterization:

An aqueous cocoon-shaped silica particle dispersion with 20 wt.-% solid content was dispersed on a carbon foil and was dried. The dried dispersion was analyzed by using Energy Filtered-Transmission Electron Microscopy (EF-TEM) (120 kilo volts) and Scanning Electron Microscopy secondary electron image (SEM-SE) (5 kilo volts). The EF-TEM image with a resolution of 2 k, 16 Bit, 0.6851 nm/pixel was used for the analysis. The images were binary coded using the threshold after noise suppression. Afterwards the particles were manually separated. Overlying and edge particles were discriminated and not used for the analysis. ECD, shape factor and sphericity as defined before were calculated and statistically classified.

If present as surfactant (F) an amphiphilic non-ionic polyoxyethylene-polyoxypropylene alkyl ether surfactant is used, which is a mixture of molecules containing, on the average, an alkyl group having 6 to 12 carbon atoms and 2 to 10 oxyethylene monomer units and 1 to 5 oxypropylene monomer units in random distribution.

CMP Compositions

Comparative and inventive CMP compositions were prepared with $H_2O_2$ and $K_2S_2O_8$ as oxidizers with different components in the range prescribed in the present subject matter. In all the compositions of Table 2 given below, the wt.-% is based on the total weight of the CMP composition. Moreover, in Table 2 if the amounts of the components other than (D) were in total y % by weight of the CMP composition, then the amount of (D) was (100−y) % by weight of the CMP composition.

TABLE 2

| CMP composition | Amount of components [wt.-%] | | | | | | | | | | | | | |
|---|---|---|---|---|---|---|---|---|---|---|---|---|---|---|
| | (A) | (B) | | | | | $H_2O_2$ | (C) | (E) | | | | (F) | pH |
| | | (B1) | (B2) | (B3) | (B4) | (B5) | | | (E1) | (E2) | (E3) | (E4) | | |
| CE 1 | 1.50 | — | 0.81 | — | — | — | 0.50 | — | — | 0.03 | — | — | 0.01 | 8.5 |
| CE 2 | 1.00 | 0.40 | — | — | — | — | 0.50 | — | 0.10 | — | — | — | 0.01 | 10 |
| CE 3 | 1.00 | 0.40 | — | — | — | — | 0.50 | — | 0.10 | — | — | — | 0.01 | 10 |
| CE 4 | 4.00 | 0.40 | — | — | — | — | 0.50 | — | 0.10 | — | — | — | 0.01 | 10 |
| CE 5 | 0.50 | — | — | 0.10 | — | — | 0.50 | — | — | — | 0.06 | — | 0.01 | 10 |
| CE 6 | 3.00 | — | — | 0.50 | — | — | 0.50 | — | — | — | 0.06 | — | 0.01 | 10 |
| CE 7 | 1.50 | — | — | 0.50 | — | — | 0.50 | — | — | — | — | 0.06 | 0.01 | 10 |
| CE 8 | 0.50 | — | — | 0.50 | — | — | 0.50 | — | — | 0.06 | — | — | 0.01 | 10 |
| Ex. 1 | 1.50 | — | 0.81 | — | — | — | — | 0.50 | — | 0.03 | — | — | 0.01 | 8.5 |
| Ex. 2 | 1.50 | — | — | 0.10 | — | — | — | 0.50 | — | 0.10 | — | — | 0.01 | 9.0 |
| Ex. 3 | 1.00 | 0.40 | — | — | — | — | — | 0.50 | 0.10 | — | — | — | 0.01 | 10 |
| Ex. 4 | 4.00 | 0.40 | — | — | — | — | — | 0.50 | 0.10 | — | — | — | 0.01 | 10 |
| Ex. 5 | 4.00 | 0.40 | — | — | — | — | — | 0.50 | 0.10 | — | — | — | 0.01 | 10 |
| Ex. 6 | 0.50 | — | — | 0.10 | — | — | — | 0.50 | — | — | 0.06 | — | 0.01 | 10 |
| Ex. 7 | 3.00 | — | — | 0.50 | — | — | — | 0.50 | — | — | 0.06 | — | 0.01 | 10 |
| Ex. 8 | 1.50 | — | — | 0.50 | — | — | — | 0.50 | — | — | — | 0.06 | 0.01 | 10 |
| Ex. 9 | 0.50 | — | — | 0.50 | — | — | — | 0.50 | — | 0.06 | — | — | 0.01 | 10 |
| Ex. 10 | 1.50 | — | — | 0.10 | — | — | — | 0.50 | 0.10 | — | — | — | 0.01 | 10 |
| Ex. 11 | 1.50 | — | — | — | 0.10 | — | — | 0.50 | 0.10 | — | — | — | 0.01 | 10 |
| Ex. 12 | 1.50 | — | — | — | — | 0.10 | — | 0.50 | 0.10 | — | — | — | 0.01 | 10 |

TABLE 3

Effect of oxidizer (C)

| Example | Co MRR [Å/min] | TiN MRR [Å/min] | TaN MRR [Å/min] | TiN:TaN MRR ratio |
|---|---|---|---|---|
| CE 1 | 980 | 519 | 186 | 2.79 |
| Ex. 1 | 1148 | 164 | 149 | 1.10 |

As evident from the Table above, the control over TiN and TaN MRR was better when used with $K_2S_2O_8$ as the oxidizer, instead of $H_2O_2$. Moreover, the MRR of Co obtained using $K_2S_2O_8$ as the oxidizer increases slightly in comparison to $H_2O_2$. This illustrates that better tuning and control of the substrate MRR is obtained using the persulfate. Hence, in all further experiments, persulfate was selected as the oxidizer for CMP composition.

TABLE 4

Effect of pH

| Example | Co MRR [Å/min] | TiN MRR [Å/min] | TaN MRR [Å/min] | TiN:TaN MRR ratio |
|---|---|---|---|---|
| Ex. 2 | 656 | 160 | 126 | 1.27 |
| Ex. 10 | 560 | 155 | 144 | 1.08 |

TABLE 5

Effect of organic compound (B)

| Example | Co MRR [Å/min] | TiN MRR [Å/min] | TaN MRR [Å/min] | TiN:TaN MRR ratio |
|---|---|---|---|---|
| Ex. 10 | 560 | 155 | 144 | 1.08 |
| Ex. 11 | 693 | 176 | 133 | 1.32 |
| Ex. 12 | 588 | 193 | 132 | 1.46 |

TABLE 6

Effect of inorganic particle (A)

| Example | Co MRR [Å/min] | TiN MRR [Å/min] | TaN MRR [Å/min] | TiN:TaN MRR ratio |
|---|---|---|---|---|
| CE 2 | 164 | 716 | 202 | 3.54 |
| CE 3 | 136 | 734 | 161 | 4.56 |
| CE 4 | 224 | 1342 | 414 | 3.24 |
| Ex. 3 | 3004 | 139 | 146 | 0.95 |
| Ex. 4 | 4212 | 520 | 390 | 1.33 |
| Ex. 5 | 4268 | 428 | 387 | 1.11 |

TABLE 7

Effect of Corrosion inhibitor (E)

| Example | Co MRR [Å/min] | TiN MRR [Å/min] | TaN MRR [Å/min] | TiN:TaN MRR ratio |
|---|---|---|---|---|
| CE 5 | 0 | 484 | 144 | 3.36 |
| CE 6 | 112 | 1150 | 527 | 2.18 |
| CE 7 | 112 | 1170 | 408 | 2.87 |
| CE 8 | 72 | 756 | 234 | 3.23 |
| Ex. 6 | 236 | 32 | 56 | 0.57 |
| Ex. 7 | 4228 | 304 | 266 | 1.14 |
| Ex. 8 | 2260 | 215 | 212 | 1.01 |
| Ex. 9 | 332 | 59 | 87 | 0.68 |

The CMP compositions according to the present subject matter show an improved polishing performance in terms of high cobalt material removal rates (MRR) [Å/min] combined with the desired TiN:TaN MRR ratio, as evident from the tables described hereinabove. Further, the wafers polished in presence of the CMP composition have a shiny surface.

Additionally, it can be concluded from the tables above that the CMP composition of the present subject matter provide a better control of the material removal rate of different materials of the substrate. The above results further illustrate that potassium persulfate (i.e. oxidizer) and pH largely influence the material removal rate of different materials of the substrate or wafer.

The invention claimed is:

1. A process for chemical mechanical polishing of a substrate comprising (i) cobalt and/or (ii) a cobalt alloy, and (iii) TiN and TaN, the process comprising contacting the substrate with a chemical mechanical polishing composition, comprising:
   (A) ≥0.10 wt.-% to ≤4.00 wt.-% of inorganic particles,
   (B) ≥0.10 wt.-% to ≤0.90 wt.-% of at least one organic compound comprising an amino group and/or at least one acid group (Y),
   (C) ≥0.20 wt.-% to ≤0.90 wt.-% of potassium persulfate,
   (D) ≥95.00 wt.-% to ≤99.58 wt.-% of an aqueous medium,
   (E) ≥0.01 wt.-% to ≤0.50 wt.-% of at least one corrosion inhibitor, and
   (K) ≥0.01 wt.-% to ≤1.50 wt.-% of at least one additive, wherein the chemical mechanical polishing composition has a pH of ≥8.5 to ≤11.0, and
   wt.-% is based on a total weight of the chemical mechanical polishing composition;
   wherein the composition contains no oxidant other than (c); and
   wherein a TiN:TaN ratio of material removal rate (MRR) is in a range of ≥0.5 to ≤2.0.

2. A process for chemical mechanical polishing of a substrate comprising (i) cobalt and/or (ii) a cobalt alloy, and (iii) TiN and TaN, the process comprising contacting the substrate with a chemical mechanical polishing composition, comprising:
   (A) ≥0.10 wt.-% to ≤4.00 wt.-% of inorganic particles,
   (B) ≥0.10 wt.-% to ≤0.90 wt.-% of at least one organic compound comprising an amino group and/or at least one acid group (Y), (C) ≥0.20 wt.-% to ≤0.90 wt.-% of potassium persulfate, (D) ≥95.00 wt.-% to ≤99.58 wt.-% of an aqueous medium, (E) ≥0.01 wt.-% to ≤0.50 wt.-% of at least one corrosion inhibitor, and (K) ≥0.01 wt.-% to ≤1.50 wt.-% of at least one additive,
   wherein wt.-% is based on a total weight of the chemical mechanical polishing composition, and wherein the chemical mechanical polishing composition has a pH of ≥8.5 to ≤10.0;
   wherein the composition contains no oxidant other than (c): and
   wherein a TiN:TaN ratio of material removal rate (MRR) is in a range of ≥0.5 to ≤2.0.

3. The process of claim 1, wherein the chemical mechanical polishing composition comprises ≥0.30 wt.-% to ≤0.70 wt.-% of potassium persulfate (C).

4. The process of claim 1, wherein the inorganic particles (A) are colloidal inorganic particles.

5. The process of claim 4, wherein the colloidal inorganic particles are colloidal silica particles.

6. The process of claim 1, wherein the at least one organic compound (B) is a non-polymeric compound with a molecular weight below 600 g/mol.

7. The process of claim 1, wherein the at least one acid group (Y) of the at least one organic compound (B) is selected from the group consisting of carboxylic acid, sulfonic acid and phosphonic acid.

8. The process of claim 1, wherein the at least one organic compound (B) is selected from the group consisting of amino acids, substituted ethylenediamine and polycarboxylic acids.

9. The process of claim 1, wherein the at least one organic compound (B) is selected from the group consisting of glycine, glutamic acid, aspartic acid, ethylenediaminetetraacetic acid, diethylene triamine pentaacetic acid, cysteic acid, aminotris(methylenephosphonic acid), diethylenetriamine penta(methylene phosphonic acid), ethylenediamine tetra(methylene phosphonic acid), malonic acid, citric acid and tartaric acid.

10. The process of claim 1, wherein the aqueous medium is de-ionized water.

11. The process of claim 1, wherein the at least one corrosion inhibitor (E) is selected from the group consisting of imidazole, benzimidazole, benzotriazole, 4-(dimethylamino) benzoic acid, terephthalic acid, isophthalic acid, 6,6'6" -(1,3,5-triazine-2,4,6-triyltriimino)trihexanoic acid, phenyltetrazole, N-lauroylsarcosine, 4-dodecylbenzene sulfonic acid, phosphoric acid C6-C10 alkyl ester, polyaspartate and mixtures and salts thereof.

12. The process of claim 1, wherein the at least one additive (K) is selected from the group consisting of surfactants (F), biocides (H), pH adjusting agents, buffer substances, stabilizers and friction reducing agents.

13. A process for the manufacture of a semiconductor device, the process comprising chemical mechanical polishing of a substrate comprising
  (i) cobalt, and/or
  (ii) a cobalt alloy, and
  (iii) TiN and TaN in the presence of a chemical mechanical polishing composition, comprising:
    (A) $\geq 0.10$ wt.-% to $\leq 4.00$ wt.-% of inorganic particles,
    (B) $\geq 0.10$ wt.-% to $\leq 0.90$ wt.-% of at least one organic compound comprising an amino group and/or at least one acid group (Y),
    (C) $\geq 0.20$ wt.-% to $\leq 0.90$ wt.-% of potassium persulfate,
    (D) $\geq 95.00$ wt.-% to $\leq 99.58$ wt.-% of an aqueous medium,
    (E) $\geq 0.01$ wt.-% to $\leq 0.50$ wt.-% of at least one corrosion inhibitor, and
    (K) $\geq 0.01$ wt.-% to $\leq 1.50$ wt.-% of at least one additive,
  wherein the chemical mechanical polishing composition has a pH of $\geq 8.5$ to $\leq 11.0$, and
  wt.-% is based on a total weight of the chemical mechanical polishing composition;
  wherein the composition contains no oxidant other than (c).; and
  wherein a TiN:TaN ratio of material removal rate (MRR) is in a range of $\geq 0.5$ to $\leq 2.0$.

14. The process of claim 1, wherein the chemical mechanical polishing composition has a pH of $\geq 8.5$ to $<10.0$.

15. The process according to claim 13, wherein the chemical mechanical polishing composition has a pH of $\geq 8.5$ to $<10.0$.

16. The process of claim 1, wherein the chemical mechanical polishing composition has a pH of $\geq 8.5$ to $\leq 9.0$.

17. The process according to claim 13, wherein the chemical mechanical polishing composition has a pH of $\geq 8.5$ to $\leq 9.0$.

18. The process of claim 1, wherein the at least one organic compound (B) is glycine.

19. The process according to claim 1, wherein the process has a material removal rate of TiN of $\geq 50$ to $\leq 650$ Å/min.

20. The process of claim 1, wherein a TiN:TaN ratio of material removal rate (MRR) is in a range of $\geq 0.5$ to $\leq 1.4$.

21. The process according to claim 1, wherein the process results in a material removal rate (MRR) of Co in an amount of from 332 to 4268 Å/min, of TiN in an amount of from 32 to 520 A/min, and of TaN in an amount of from 56 to 390 Å/min.

* * * * *